US012782584B2

(12) United States Patent
Allen

(10) Patent No.: US 12,782,584 B2
(45) Date of Patent: Nov. 3, 2026

(54) NAVIGATIONAL SYSTEMS AND METHODS FOR SIMULATING PERFORMANCE OF ONE OR MORE RECEIVERS OF ONE OR MORE VEHICLES

(71) Applicant: The Aerospace Corporation, El Segundo, CA (US)

(72) Inventor: David W. Allen, Fairfax, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 176 days.

(21) Appl. No.: 18/328,483

(22) Filed: Jun. 2, 2023

(65) Prior Publication Data

US 2024/0402352 A1 Dec. 5, 2024

Related U.S. Application Data

(63) Continuation of application No. 17/194,797, filed on Mar. 8, 2021, now abandoned.

(51) Int. Cl.

*G01S 19/23* (2010.01)
*G01S 19/21* (2010.01)
*G06F 30/20* (2020.01)

(52) U.S. Cl.

CPC .............. *G01S 19/23* (2013.01); *G01S 19/21* (2013.01); *G06F 30/20* (2020.01)

(58) Field of Classification Search

CPC .......... G01S 19/23; G01S 19/21; G06F 30/20; G06F 30/25; G06F 30/27; G06F 30/28

See application file for complete search history.

(56) References Cited

U.S. PATENT DOCUMENTS

| | | | |
|---|---|---|---|
| 7,797,132 B1 | 9/2010 | Lele et al. | |
| 9,274,212 B2 | 3/2016 | Shen | |
| 10,746,881 B2 | 8/2020 | Maier | |

(Continued)

FOREIGN PATENT DOCUMENTS

CN 107085385 A * 8/2017 ............. G05B 17/02

OTHER PUBLICATIONS

Constantinescu, Aurélian, René Landry Jr, and lurie Ilie. "Hybrid GPS/Galileo/GLONASS IF software signal generator." Proceedings of the 18th International Technical Meeting of the Satellite Division of The Institute of Navigation (ION GNSS 2005). 2005. (Year: 2005).*

(Continued)

*Primary Examiner* — Michael Edward Cocchi

(74) *Attorney, Agent, or Firm* — Sheppard, Mullin, Richter & Hamoton LLP

(57) ABSTRACT

Navigation systems and methods for a position, navigation, and timing (PNT) solution of one or more vehicles. Operations of the system and the method can include simulating, by a processor, a set of observables that a receiver of the one or more vehicles observes in a truth state; simulating, by the processor, addition of interference to the set of observables to generate a simulated set of corrupted observables; and simulating, by a processor, the PNT solution, comprising applying a receiver model to the simulated set of corrupted observables, the receiver model being configured to emulate how the receiver of the responds to the one or more vehicles simulated set of corrupted observables.

17 Claims, 1 Drawing Sheet

(56) References Cited

U.S. PATENT DOCUMENTS

| | | | | |
|---|---|---|---|---|
| 11,150,356 | B2 * | 10/2021 | Whitworth | G01S 19/23 |
| 2013/0271317 | A1 | 10/2013 | Goel et al. | |
| 2014/0253372 | A1 | 9/2014 | Davis et al. | |
| 2016/0280401 | A1 * | 9/2016 | Driscoll | G01S 5/011 |
| 2017/0234979 | A1 * | 8/2017 | Mathews | G01S 1/024<br>342/357.64 |
| 2017/0242129 | A1 | 8/2017 | Kallankari et al. | |
| 2018/0188379 | A1 * | 7/2018 | Whitworth | G01S 19/21 |
| 2019/0277976 | A1 * | 9/2019 | Naveen | G01S 19/24 |
| 2021/0096265 | A1 * | 4/2021 | Ilie | G01S 19/03 |
| 2021/0173077 | A1 * | 6/2021 | Ford | G01S 13/02 |
| 2022/0066049 | A1 * | 3/2022 | Krefft | G01S 19/23 |

OTHER PUBLICATIONS

Dong, Lei. "IF GPS signal simulator development and verification." 2003. The University of Calgary, www. geomatics.ucalgary. ca (2003). (Year: 2003).*

Nguyen, Tu Thi-Thanh, et al. "Design and validation of a flexible software-based generator of realistic GNSS signals." 2017 European Navigation Conference (ENC). IEEE, 2017. (Year: 2017).*

Soubielle, Jérôme, et al. "Description of an Interference Test Facility (ITF) to assess GNSS receivers performance in presence of interference." 2010 5th ESA Workshop on Satellite Navigation Technologies and European Workshop on GNSS Signals and Signal Processing (NAVITEC). IEEE, 2010. (Year: 2010).*

Rugamer et al., "GNSS Over-the-Air Testing Using Wave Field Synthesis," Proceedings of the 26th International Technical Meeting of the Satellite Division of The Institute of Navigation (ION GNSS+ 2013), Nashville, TN, pp. 1931-1943. (2013).

* cited by examiner

NAVIGATIONAL SYSTEMS AND METHODS FOR SIMULATING PERFORMANCE OF ONE OR MORE RECEIVERS OF ONE OR MORE VEHICLES

FIELD

This application relates to receivers, such as may be used with navigational satellites, that may be exposed to interference.

BACKGROUND

Receivers may estimate the position, navigation, and timing (PNT) of vehicles using navigational radio frequency (RF) signals received from ground-based sources and/or from a space-based global navigation satellite system (GNSS), such as the global positioning system (GPS), Galileo, GLONASS, or Doppler orbitography and radiopositioning integrated by satellite (DORIS). For example, a vehicle may include a receiver that receives satellite signals and estimates the PNT of the vehicle based on such signals. If the vehicle is moving, then its estimated PNT may need to be updated frequently, and the estimated PNT even may be used in a feedback loop to guide further movement of the vehicle.

However, receivers may suffer from interference that may cause errors in the receiver's accuracy in estimating the vehicle's PNT. Such interference may be intentional or unintentional. Intentional interference that disrupts the receiver's reception of the intended signal may be referred to as jamming, while intentional interference including false signals that mimic a GNSS or other navigational RF signal and leads the receiver to believe it is at a false location may be referred to as spoofing. Duplicate signals, which may be intentional or unintentional, may be referred to as multipath interference. In some circumstances, navigational errors caused by interference may cause a moving vehicle to go off of its intended course, which may be catastrophic. Illustratively, the ground based augmentation system (GBAS) transmits PNT corrections to landing airplanes but may become unusable if subjected to jamming or other interference.

It is therefore useful to simulate the effects of interference upon receiver performance in different scenarios. Such interference has been simulated by adding noise and offsets to a receiver's PNT solution to simulate degraded tracking, but this is an imprecise approach. Alternatively, the receiver may be physically tested in a test event where realistic interference is broadcast and the receiver's PNT solution in that scenario is evaluated, which is an expensive and time-consuming approach.

SUMMARY

Systems and methods for simulating performance of receivers in realistic interference scenarios are provided herein.

Some examples herein provide a method for simulating the performance of a receiver. The method may include (a) generating a set of observables that a receiver in a truth state would ideally see. The method further may include (b) adding interference to the set of observables to generate a set of corrupted observables. The method further may include (c) generating a position, navigation, and timing (PNT) solution using the set of corrupted observables.

In some examples, the truth state includes one or more of a position, geometry, kinematics, and dynamics of the receiver. In some examples, the truth state further includes one or more of a position, geometry, kinematics, and dynamics of one or more transmitters.

In some examples, the truth state includes a previous PNT solution of the receiver.

In some examples, generating the set of observables includes applying a signal transmission model to the truth state. In some examples, the signal transmission model includes a global positioning system (GPS) constellation model, a Galileo constellation model, a GLONASS constellation model, or a Doppler orbitography and radiopositioning integrated by satellite (DORIS) constellation model.

In some examples, the set of observables includes one or more of: pseudorange, range, time-delay-of-arrival (TDOA), navigation data, carrier phase, code phase, Doppler, and signal-to-noise ratio (SNR).

In some examples, adding interference to the set of observables includes applying a signal disruption model to the set of observables. In some examples, the signal disruption model applies one or more errors selected from the group consisting of simulated unintentional interference, jamming, and spoofing, to the set of observables. In some examples, one or more of the errors are scaled or correlated based on the truth state. In some examples, the method further includes validating the errors against actual receiver hardware.

In some examples, generating the PNT solution includes applying a receiver model to the set of corrupted observables.

In some examples, the method further includes outputting the PNT solution to a simulation of a vehicle; producing a new truth state based on the simulation of the vehicle; and repeating steps (a) through (c) using the new truth state.

In some examples, the method further includes using the PNT solution to validate that flight software will function as expected under a possible flight condition.

Some examples herein provide a system for simulating the performance of a receiver. The system may include a processor and a computer-readable medium storing instructions for causing the processor to perform operations. The operations may include (a) implementing a signal transmission model to generate a set of observables that a receiver in a truth state would ideally see. The operations may include (b) implementing a signal disruption model to add interference to the set of observables to generate a set of corrupted observables. The operations may include (c) implementing a receiver model to generate a position, navigation, and timing (PNT) solution using the set of corrupted observables.

DETAILED DESCRIPTION

Systems and methods for simulating performance of receivers in realistic interference scenarios are provided herein. More specifically, the performance of a receiver may be simulated beginning with a desired "truth" state of the receiver that corresponds to a known, estimated, assumed, or calculated PNT of the receiver. The truth state is used to generate a set of observables that simulates the signals that the receiver would ideally receive, e.g., without any corruption caused by interference. Illustratively, the set of observables may include simulated signals from a constellation of satellites, such as GPS, Galileo, GLONASS or DORIS satellites; any relative location and motion of such satellites relative to the receiver may be included in the truth state. Interference then is added to the set of observables so as to create a set of corrupted observables that realistically simulates the signals that the receiver in the truth state would actually receive. A PNT solution then is generated using the set of corrupted observables, that simulates the processing that the receiver would perform in this interference scenario. As described in greater detail further below, the resulting PNT solution may be used in a variety of practical applications, such as evaluating the navigation of a vehicle that would be controlled using the receiver in the interference scenario, evaluating the function of flight software that would be controlled using the receiver in the interference scenario, evaluating the design of the receiver in the interference scenario, or evaluating the design of counter-interference measures in the interference scenario. As such, the present systems and methods are expected to be significantly more accurate than merely adding noise and offsets to a receiver's PNT solution to simulate degraded tracking, and may be readily validated by laboratory testing which may involve significantly less time and expense than physically taking the receiver to a test event where realistic interference is broadcast.

Figure 1:
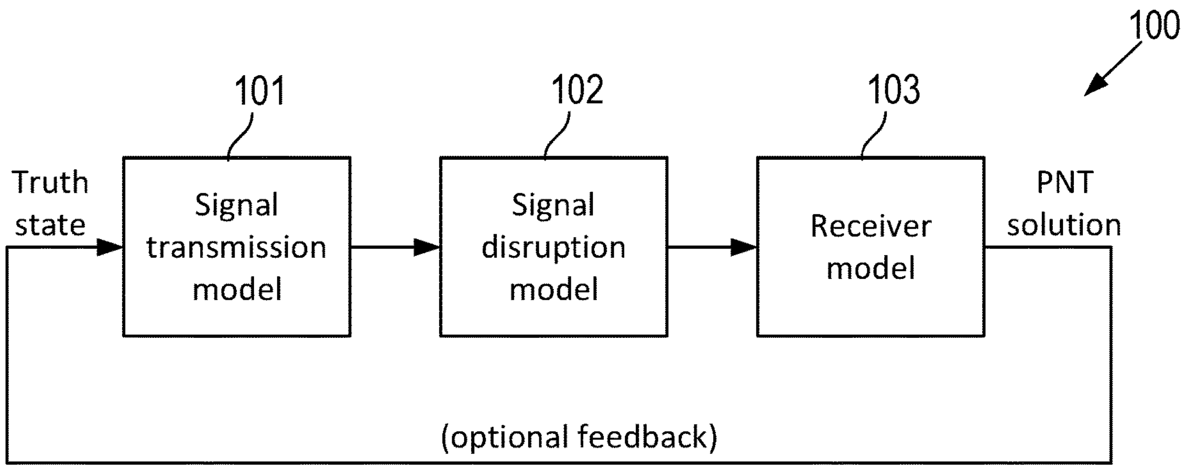
FIG. 1 schematically illustrates a system for simulating the performance of a receiver in a realistic interference scenario, according to some examples provided herein.

FIG. 1 schematically illustrates a system for simulating the performance of a receiver in a realistic interference scenario, according to some examples provided herein. System 100 illustrated in FIG. 1 includes circuitry implementing signal transmission model 101, circuitry implementing signal disruption model 102, and circuitry implementing receiver model 103. The circuitry implementing signal transmission model 101 may receive as input a truth state, and may generate a set of observables that a receiver in the truth state would ideally see. The circuitry implementing signal disruption model 102 may receive the set of observables from signal transmission model 101, and may add interference to the set of observables to generate a set of corrupted observables. The circuitry implementing receiver model 103 may receive the set of corrupted observables from signal disruption model 102, and may generate a PNT solution using the set of corrupted observables. The PNT solution may simulate the performance of the receiver that is modeled using receiver model 103 that is simulated to be in the truth state and to receive signals as simulated by signal transmission model 101, which signals are simulated to be corrupted as simulated by signal disruption model 102.

The circuitry of system 100 may be implemented using any suitable combination of hardware and software. For example, signal transmission model 101, signal disruption model 102, and/or receiver model 103 may be implemented using a suitably programmed field-programmable gate array (FPGA) or application-specific integrated circuit (ASIC). FPGAs and ASICs are commercially available, and methods of programming same to achieve desired logical programming are known in the art. In still other embodiments, one or more of such models can be implemented by a suitably programmed computer, e.g., a personal computer including a processor and a non-transitory computer-readable medium storing instructions to cause the processor to perform the steps of the present methods or to implement the models. Alternatively, the processor can include a digital processor, such as a central processing unit (CPU) or graphics processor unit (GPU), or an analog processor.

As noted further above, the truth state that may be input to signal transmission model 101 may correspond to a known, estimated, assumed, or calculated PNT of the receiver. The truth state may, for example, include coordinates of an actual position at which the receiver is implemented, e.g., coordinates that are obtained using information independent of the receiver's PNT estimate. Alternatively, the truth state may, for example, include coordinates of an estimated position at which the receiver is implemented, e.g., a PNT solution that the receiver calculates using navigational RF signals. Alternatively, the truth state may, for example, include coordinates of an actual position at which the receiver is planned to be implemented. In still other examples, the truth state may include coordinates of a position that is calculated in a manner such as described herein, e.g., a previous PNT solution of the simulated receiver that is fed back from the receiver model 103 as the truth state into signal transmission model 101 in a manner such as illustrated in FIG. 1. It will be appreciated that the truth state additionally, or alternatively, may include more than a position. For example, the receiver may have a geometry, kinematics, and dynamics relative to the environment in which it is simulated to be located, and such parameters may be included in the truth state. Additionally, the transmitters sending simulated signals to the receiver also may have a geometry, kinematics, and dynamics relative to the environment in which the receiver is simulated to be located, and such parameters may be included in the truth state. As such, the truth state of the simulated receiver, which includes such information as to sufficiently define the position and velocity of a receiver at a specific time or provide sufficient information that realistic approximations may be produced, may express the PNT of the receiver, as well as of any relevant signal sources transmitting navigational signals to the receiver or sources of interference impacting the receiver. The truth state may be stored in any suitable non-transitory computer-readable medium coupled to the circuitry implementing signal transmission model 101, or may be input as a signal to such circuitry.

As noted above, applying signal transmission model 101 illustrated in FIG. 1 to the truth state input thereto generates a set of observables that a receiver in the truth state would ideally see. For example, signal transmission model 101 may include a global positioning system (GPS) constellation model, a Galileo constellation model, a GLONASS constellation model, or a DORIS constellation model. Such constellation models may be commercially available, e.g., as part of GPS, GNSS, or DORIS simulators. Such constellation models may be implemented in software, and may function by taking the truth PVT of the receiver, and determining the state of the receiver when it sent the signal that the receiver sees at the truth PVT. That is, such constellation models may provide a model for time delays of arrival of signals. The particular signal transmission model 101 used may be selected based on the particular type of receiver model 103 being used. Illustratively, a GPS constellation model 101 would be used with a GPS receiver model 103; a Galileo constellation model 101 would be used with a Galileo receiver model 102; a GLONASS constellation model 101 would be used with a GLONASS receiver model 102; or a DORIS constellation model would be used with a DORIS receiver model.

As used herein, an "observable" is intended to mean any characteristic of a signal that can be used to produce a navigation solution. Pseudorange and carrier phase both provide complementary information about the range, while Doppler is essentially a measure of the rate of change of the range. Other example measurements that are sometimes used for specific purposes include Carrier-to-Noise ratio, inter-channel and inter-frequency biases, and the like. Illustratively, the set of observables used in the present systems and methods may include any suitable combination of pseudorange, range, time-delay-of-arrival (TDOA), navigation data, carrier phase, code phase, Doppler, and signal-to-noise ratio (SNR). For example, time and atmospheric effects may generate noise that impacts the pseudorange of signals received by the receiver. As such, applying the signal transmission model 101 to the truth state may quantitatively simulate the pseudorange, range, TDOA, navigation data, carrier phase, code phase, Doppler shift, SNR, and the like of each of the different simulated signals in the collection of signals that the receiver would receive, without any corruption of such signals by interference.

In order to realistically simulate the impact of an interference scenario on the receiver, the set of observables output by signal transmission model 101 is provided to signal disruption model 102. Signal disruption model 102 may apply one or more errors to the set of observables, such as simulated unintentional interference, jamming, and/or spoofing. One or more of the errors may be scaled or correlated based on the truth state. For example, if the receiver has a particular position, geometry, kinematics, or dynamics relative to a given interference source then signal disruption model 102 may scale or correlate the error(s) caused by that interference source appropriately. Note that the errors readily may be validated against actual receiver hardware.

The set of corrupted observables then is provided to receiver model 103, which generates a PNT solution based thereon. The receiver model 103 emulates how a receiver would respond to the set of corrupted observables and produce a PNT solution. Receiver models 103 are commercially available, such as the GNSS-SDR open-source receiver model. Depending on the particular algorithms implemented, the receiver model may only utilize a subset of the available observables. Illustratively, in some examples the signal disruption model 102 may apply errors to either the geometry-related observables or to the demodulated observables, so that the receiver model may be tested for both data-demodulation and navigation filter performance. Additionally, the signal disruption model may introduce additional observables related to false or duplicated signals, e.g., from multipath reflections.

Figure 2:
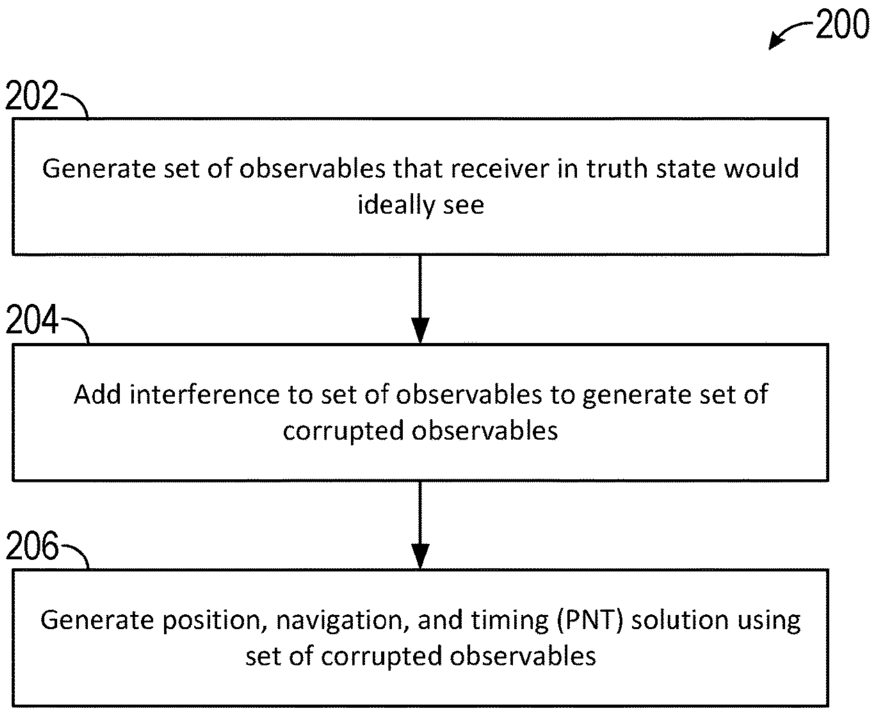
FIG. 2 illustrates a flow of operations in a method for simulating the performance of a receiver in a realistic interference scenario, according to some examples provided herein.

It will be appreciated that system 100 described with reference to FIG. 1 may be implemented in any suitable method. For example, FIG. 2 illustrates a flow of operations in a method for simulating the performance of a receiver in a realistic interference scenario, according to some examples provided herein. Method 200 illustrated in FIG. 2 may include generating a set of observables that a receiver in a truth state would ideally see (operation 202). For example, generating the set of observables may include applying a signal transmission model to the truth state in a manner such as described with reference to FIG. 1. Method 200 illustrated in FIG. 2 also may include adding interference to the set of observables to generate a set of corrupted observables (operation 204). For example, adding interference to the set of observables may include applying a signal disruption model to the set of observables in a manner such as described with reference to FIG. 1. Illustratively, the signal disruption model may apply one or more errors selected from the group consisting of simulated unintentional interference, jamming, and spoofing, to the set of observables. One or more of the errors may be scaled or correlated based on the truth state, and/or may be validated against actual receiver hardware. Method 200 illustrated in FIG. 2 also may include generating a position, navigation, and timing (PNT) solution using the set of corrupted observables (operation 206). For example, generating the PNT solution may include applying a receiver model to the set of corrupted observables in a manner such as described with reference to FIG. 1.

It will be appreciated that system 100 described with reference to FIG. 1 and method 200 described with reference to FIG. 1 may be used for any suitable practical application.

For example, vehicles may include receivers using navigational RF signals (e.g., GPS) to guide the vehicles. As such, interference with the navigational RF signals potential can cause a catastrophic loss of the vehicle and its passengers, as well as any payload. The present systems and methods may be used to help understand how different interference scenarios may affect guidance of a vehicle, such as a launch vehicle—for example, whether certain signal types or geometries of jamming or spoofing signals may cause the vehicle to crash or otherwise may require the flight to be terminated. Additionally, the present systems and methods may be used to help improve design of compensating for different interference scenarios may be compensated for—for example, whether suitable anti-jamming signals may be usable to cancel the interference or whether suitable interference-suppression techniques may be usable to cancel the interference from the RF signals while leaving adequate SNR for use in guiding the vehicle. Illustratively, the PNT solution calculated using system 100 or method 200 may be output to a simulation of a vehicle that, for example, describes guidance of the vehicle based on that PNT solution. Based on such simulation (e.g., based on a time step of that simulation that causes a change in position, geometry, kinematics, or dynamics of the vehicle) a new truth state may be generated and may be used as input to the signal transmission model to generate a new set of observables that then is processed using the signal disruption model and receiver model in a manner such as described elsewhere herein. As such, system 100 and method 200 may be used as part of a closed-loop simulation in which the vehicle simulation may react to the PNT solution.

It will be appreciated that the present systems and methods suitably may be applied to a wide range of other applications. For example, the PNT solution may be used to validate that flight software will function as expected under a possible flight condition, and the software may be modified if it is found that it does not function as expected. Such an application may be referred to as a “software-in-the-loop” (SIL) simulation. As another example, the present systems and methods may be used in receiver algorithm development, e.g., as a tool to test receiver algorithms under a wide range of scenarios without having to build hardware.

It will further be appreciated that the present systems and methods may be used to simulate receivers for any suitable radio-navigation system (such as eLORAN), optical-navigation system, or any radio-communication service. These systems would function in much the same way as for GNSS. For example, optical navigation systems, e.g., laser cross-linked satellites, function by using light (typically with wavelengths less then 2000 nm) to transmit timing information and data. In such a system, the present signal disruption model may include effects from phenomena like scattering and atmospheric seeing. Furthermore, any radio-communication signal may be used for navigation. These so-called "Signals of Opportunity" carry some information that can be used for navigation, albeit at significantly lower fidelity than dedicated radio-navigation services.

It will be appreciated that the present systems and methods may realistically simulate a receiver's PNT solutions under hundreds, thousands, tens of thousands, or even more, different interference scenarios and different truth states. Illustratively, the present systems and methods may be used to simulate the effect upon a receiver of realistically degraded signals, both from noise and jamming; analyze the accuracy of different signals in different environments (e.g., L1C/A vs. L1P(Y) accuracy); the effects of spoofing; signal reception degradation, such as code versus carrier tracking and bit errors; the influence of receiver dynamics; different navigation filters; and/or the impact of specific threats. In comparison, physically taking the receiver to a test event where realistic interference is broadcast may have a significantly constrained set of different interference scenarios that may not explore a sufficient number of variables to predict an outcome of using the receiver in a range of possible scenarios.

While preferred embodiments of the invention are described herein, it will be apparent to one skilled in the art that various changes and modifications may be made. The appended claims are intended to cover all such changes and modifications that fall within the true spirit and scope of the invention.

What is claimed is:

1. One or more non-transitory computer-readable mediums storing instructions that, when executed by one or more processors, cause the one or more processors to perform operations comprising:

obtaining, using a physical receiver of a vehicle, a position, navigation, and timing (PNT) of the physical receiver in a truth state defined by an absence of interference;

applying, by the one or more processors, a signal transmission model to the PNT so that a set of observables that the physical receiver observes in the truth state is simulated, the signal transmission model comprising a global positioning system (GPS) constellation model, the set of observables comprising pseudorange, range, time-delay-of-arrival (TDOA), navigation data, carrier phase, code phase, Doppler, and signal-to-noise ratio (SNR);

simulating, by the one or more processors, addition of interference to the set of observables to generate a simulated set of corrupted observables, wherein simulating addition of interference to the set of observables comprises applying a signal disruption model to the set of observables, and wherein the signal disruption model applies one or more errors comprising simulated unintentional interference, jamming, and spoofing, to the set of observables;

simulating, by the one or more processors, a PNT solution of the physical receiver to validate a function of the physical receiver under a flight condition, wherein simulating the PNT solution comprises applying a receiver model to the simulated set of corrupted observables, the receiver model being configured to emulate how the physical receiver responds to the simulated set of corrupted observables;

obtaining, by the physical receiver, one or more navigational radio frequency (RF) signals subject to physical interference;

compensating, by the physical receiver, for the physical interference based on simulating the PNT solution of the physical receiver; and controlling, using the one or more navigational RF signals obtained by the physical receiver, movement of the vehicle.

2. The one or more non-transitory computer-readable mediums of claim 1, the operations further comprising: correlating the one or more of the errors based on the truth state.

3. The one or more non-transitory computer-readable mediums of claim 1, the operations further comprising validating the one or more errors against the physical receiver.

4. The one or more non-transitory computer-readable mediums of claim 1, wherein of simulating, by the one or more processors, addition of interference comprises simulating intentional interference that mimics a navigational RF signal.

5. The one or more non-transitory computer-readable mediums of claim 1, wherein obtaining the PNT comprises: calculating, by the physical receiver, using received navigational RF signals, the PNT.

6. The one or more non-transitory computer-readable mediums of claim 1, wherein the signal transmission model comprises an additional constellation model.

7. The one or more non-transitory computer-readable mediums of claim 1, wherein the signal transmission model comprises a Doppler orbitography and radiopositioning integrated by satellite (DORIS) constellation model configured for use with a DORIS receiver model.

8. A system, comprising:

a physical receiver of a vehicle, the physical receiver configured to obtain a position, navigation, and timing (PNT) of the physical receiver in a truth state defined by an absence of interference;

one or more processors; and one or more non-transitory computer-readable mediums storing instructions that, when executed by the one or more processors, cause the one or more processors to perform operations comprising:

applying a signal transmission model to the PNT so that a set of observables that the physical receiver observes in the truth state is simulated, the signal transmission model comprising a global positioning system (GPS) constellation model, the set of observables comprising pseudorange, range, time-delay-of-arrival (TDOA), navigation data, carrier phase, code phase, Doppler, and signal-to-noise ratio (SNR);

simulating, by the one or more processors, addition of interference to the set of observables to generate a simulated set of corrupted observables, wherein simulating addition of interference to the set of observables comprises applying a signal disruption model to the set of observables, and wherein the signal disruption model applies one or more errors comprising simulated unintentional interference, jamming, and spoofing, to the set of observables; and simulating, by the one or more processors, a PNT solution of the physical receiver to validate a function of the physical receiver under a flight condition, wherein simulating the PNT solution comprises applying a receiver model to the simulated set of corrupted observables, the receiver model being configured to emulate how the physical receiver responds to the simulated set of corrupted observables, when after the PNT solution of the physical receiver is simulated:

the physical receiver is configured to obtain one or more navigational radio frequency (RF) signals that are subject to physical interference, and compensate for the physical interference based on simulating the PNT solution of the physical receiver; and the one or more processors are configured to control, using the one or more navigational RF signals obtained by the physical receiver, movement of the vehicle.

9. The system of claim 8, wherein the physical receiver is configured to obtain the PNT by calculating, using received navigational RF signals, the PNT.

10. The system of claim 8, wherein the signal transmission model comprises:

an additional constellation model; or a Doppler orbitography and radiopositioning integrated by satellite (DORIS) constellation model configured for use with a DORIS receiver model.

11. A method, comprising:

obtaining, using a physical receiver of a vehicle, a position, navigation, and timing (PNT) of the physical receiver in a truth state defined by an absence of interference;

applying, by one or more processors, a signal transmission model to the PNT so that a set of observables that the physical receiver observes in the truth state is simulated, the signal transmission model comprising a global positioning system (GPS) constellation model, the set of observables comprising pseudorange, range, time-delay-of-arrival (TDOA), navigation data, carrier phase, code phase, Doppler, and signal-to-noise ratio (SNR);

simulating, by the one or more processors, addition of interference to the set of observables to generate a simulated set of corrupted observables, wherein simulating addition of interference to the set of observables comprises applying a signal disruption model to the set of observables, and wherein the signal disruption model applies one or more errors comprising simulated unintentional interference, jamming, and spoofing, to the set of observables;

simulating, by the one or more processors, a PNT solution of the physical receiver to validate a function of the physical receiver under a flight condition, wherein simulating the PNT solution comprises applying a receiver model to the simulated set of corrupted observables, the receiver model being configured to emulate how the physical receiver responds to the simulated set of corrupted observables;

obtaining, by the physical receiver, one or more navigational radio frequency (RF) signals that are subject to physical interference;

compensating, by the physical receiver, for the physical interference based on simulating the PNT solution of the physical receiver; and controlling, using the one or more navigational RF signals obtained by the physical receiver, movement of the vehicle.

12. The method of claim 11, further comprising: correlating the one or more of the errors based on the truth state.

13. The method of claim 11, further comprising: validating the one or more errors against the physical receiver.

14. The method of claim 11, wherein simulating, by the one or more processors, addition of interference comprises simulating intentional interference that mimics a navigational RF signal.

15. The method of claim 11, wherein obtaining the PNT comprises: calculating, by the physical receiver, using navigational RF signals, the PNT.

16. The method of claim 11, wherein the signal transmission model, the signal disruption model, and the receiver model are each implemented in a suitably programmed field-programmable gate array (FPGA) or an application-specific integrated circuit (ASIC).

17. The method of claim 11, further comprising: iteratively performing operations of applying the signal transmission model, simulating addition of interference, and simulating the PNT solution.

* * * * *